United States Patent
Weng

(10) Patent No.: US 6,600,651 B1
(45) Date of Patent: Jul. 29, 2003

(54) PACKAGE WITH HIGH HEAT DISSIPATION

(75) Inventor: Chun-Jen Weng, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/874,153

(22) Filed: Jun. 5, 2001

(51) Int. Cl.⁷ ................................................ H05K 7/20
(52) U.S. Cl. ................ 361/700; 361/704; 361/707; 361/709; 361/699; 257/715; 174/15.2; 165/80.4; 165/109.26
(58) Field of Search .................. 361/688, 690, 361/700, 699, 702, 704, 707; 257/706, 707, 715, 675, 714, 722, 796; 174/15.2; 165/80.4, 104.33, 185

(56) References Cited

U.S. PATENT DOCUMENTS

| | | | |
|---|---|---|---|
| 4,995,451 A | * 2/1991 | Hamburgen | 165/104.33 |
| 5,198,889 A | * 3/1993 | Hisano et al. | 257/678 |
| 5,349,237 A | * 9/1994 | Sayka et al. | 257/715 |
| 5,582,242 A | * 12/1996 | Hamburgen et al. | 165/104.21 |
| 5,780,928 A | * 7/1998 | Rostoker et al. | 257/713 |
| 6,085,831 A | * 7/2000 | DiGiacomo et al. | 165/104.33 |
| 6,208,513 B1 | * 3/2001 | Fitch et al. | 361/704 |
| 6,272,034 B1 | * 8/2001 | Kinoshita et al. | 365/52 |

* cited by examiner

Primary Examiner—Boris Chervinsky
(74) Attorney, Agent, or Firm—J.C. Patents

(57) ABSTRACT

A package with high heat dissipation, comprising a carrier and a chip located thereon, with electric connection between the chip to the carrier. A molding compound is used to encapsulate the chip, part of the carrier, and the connection between the chip and the carrier. A heat pipe is provided such that one end thereof is embedded in the molding compound, is close to the active surface of the chip and is substantially normal to the chip, and the other end thereof is extended outside of the molding compound.

13 Claims, 5 Drawing Sheets

PACKAGE WITH HIGH HEAT DISSIPATION

BACKGROUND OF THE INVENTION

1. Field of the Invention

The present invention relates to a semiconductor package. More specifically, the present invention relates to a package with high heat dissipation.

2. Description of the Related Art

As semiconductor technology progresses, electronic devices tend to have various functions, smaller dimensions, and greater memory capacity, etc. Semiconductor package technology becomes important along with the developments of electronic devices.

In packaging, an IC, a transistor, a capacitor, a resistor etc. are packed into a small body. High-density packages that meet commercial demands, such as ball grid array (BGA), CSP (chip scale package) and MCM (multi-chip module), have been developed and put into practice. However, as the operational speed for the chip increases and the package size is reduced, heat is increasingly generated and accumulated. Therefore, heat dissipation is very important for a high-density package.

FIG. 1 is a schematic view of one conventional package. As shown in FIG. 1, a chip 109 is attached to a die pad 100 using epoxy 104, and the chip 109 is connected to inner leads 103 by gold wires 106. After encapsulation, outer leads are exposed from the package. A heat sink 100 is additionally provided for the package, and the heat sink contacts the surface of the package for heat dissipation.

In such a package, the molding compound exists between the heat sink and the chip, thereby decreasing the performance for heat dissipation. Since the heat sink is located on the package, thermal impedance can occur and is caused by the air, thereby greatly influencing the heat dissipation performance. Moreover, the heat sink is provided after encapsulation, so an additional step is required to obtain the whole package.

FIG. 2 is a schematic view of another conventional package. The chip 109 is attached to a die pad 100 and connected to inner leads 103 by gold wires 106. A molding compound is used to encapsulate the connection between the chip and the carrier, such that contact with the atmosphere can be avoided. A heat slug 112 is provided in the package before encapsulation.

In this case, heat is difficult to be dissipated effectively through the heat slug, because the heat slug is provided only inside the package without any extension.

SUMMARY OF THE INVENTION

Therefore, it is one object of the present invention to provide a package with high heat dissipation, comprising a carrier and a chip located thereon, with electric connection between the chip and the carrier. A molding compound is used to encapsulate the chip, part of the carrier, and the connection between the chip and the carrier. A heat pipe is provided such that one end thereof is embedded in the molding compound, is close to the active surface of the chip and is substantially normal to the chip. The other end of the heat pipe is extended outside of the molding compound.

DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
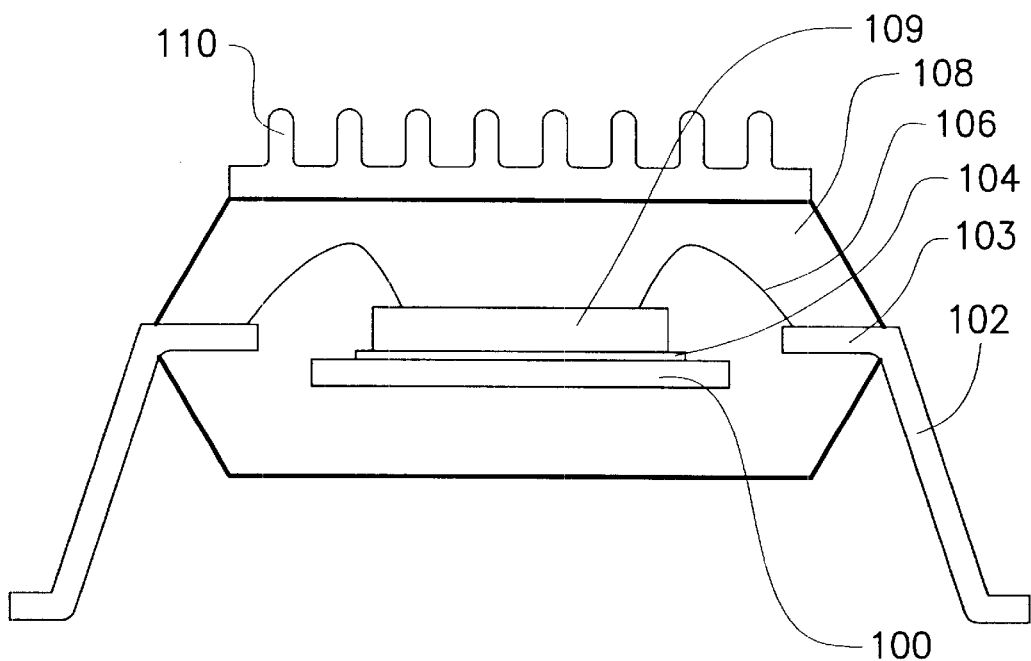
FIG. 1 is a schematic view of one conventional package.
Figure 2:
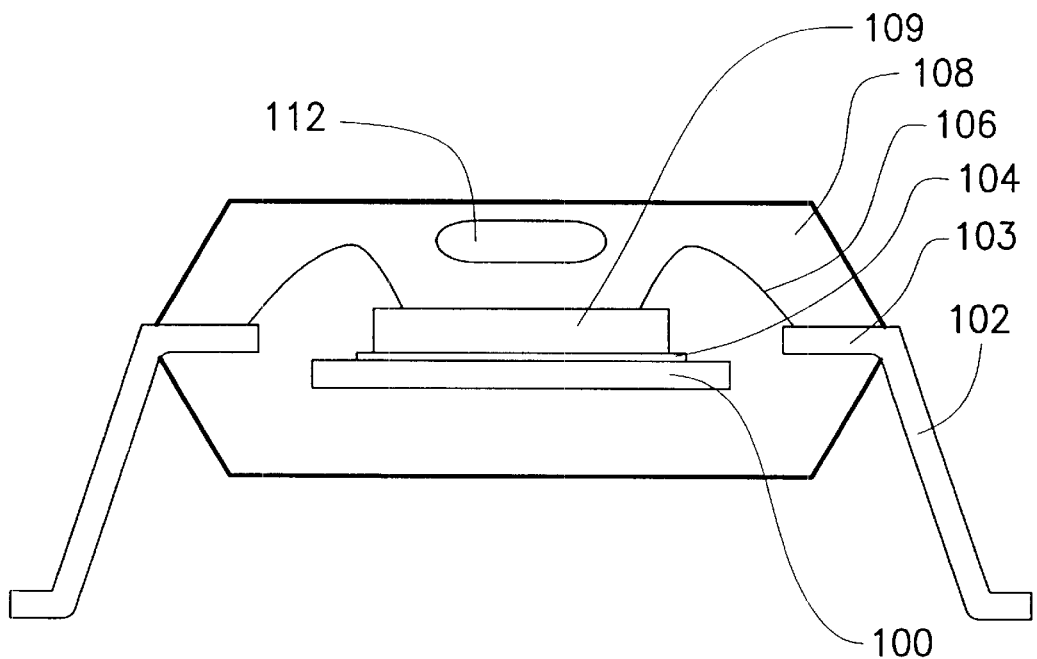
FIG. 2 is a schematic view of another conventional package.

Reference will now be made in detail to the present preferred embodiments of the invention, examples of which are illustrated in the accompanying drawings. Whenever possible, the same reference numbers are used in the drawings and the description to refer to the same or like parts.

Figure 3:
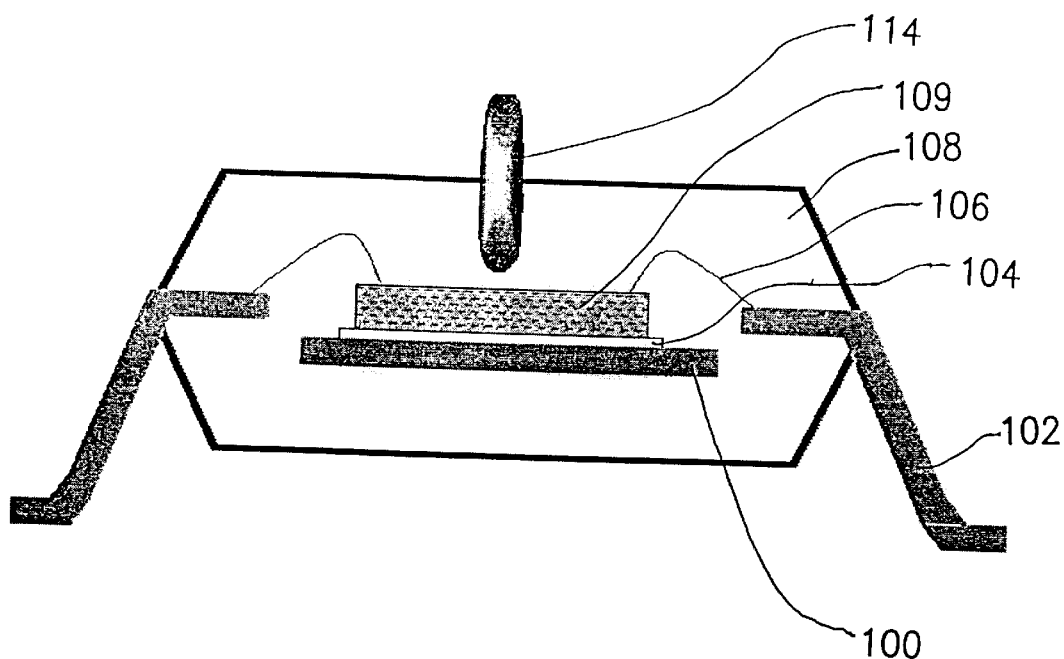
FIG. 3 is a schematic, cross sectional view of a package according to a first preferred embodiment of the present invention.

FIG. 3 is a schematic, cross sectional view of a package with high heat dissipation (hereinafter referred to as a highly heat dissipated package) according to a first preferred embodiment of the present invention.

In the highly heat dissipated package of this embodiment, a lead frame is used as a carrier of a chip. The lead frame consists of a die pad 100 and leads 102. The chip 109 has an active surface and a back surface. The chip 109 is adhered to the die pad 100 by the back surface of the chip 109 with an adhesive such as epoxy 104. A bonding pad (not shown) on the active surface is electrically connected to the lead 102 by a wire, such as a gold wire 106. A molding compound 108 is used to encapsulate the chip 109, the die pad 100 and the inner portions of the leads 102. The package of the present invention is provided with a heat pipe 114, one end of which is embedded in the molding compound 108, is close to the active surface of the chip 109 and is substantially normal to the chip, and the other end of which is extended outside of the molding compound 108. The heat pipe 114 is a closed pipe made of a heat conductive metal, which contains a heat conductive liquid (not shown) to transmit the heat by conduction and convection. With one end of the heat pipe 114 embedded in the molding compound 108 and close to the chip 109, the heat generated from the chip 109 is transmitted directly to the heat pipe 114. With the other end of the heat pipe 114 extended outside of the molding compound 108, the heat is dissipated. Furthermore, the heat pipe can be embedded in the package during the encapsulating process, without any additional processing.

Figure 4A:
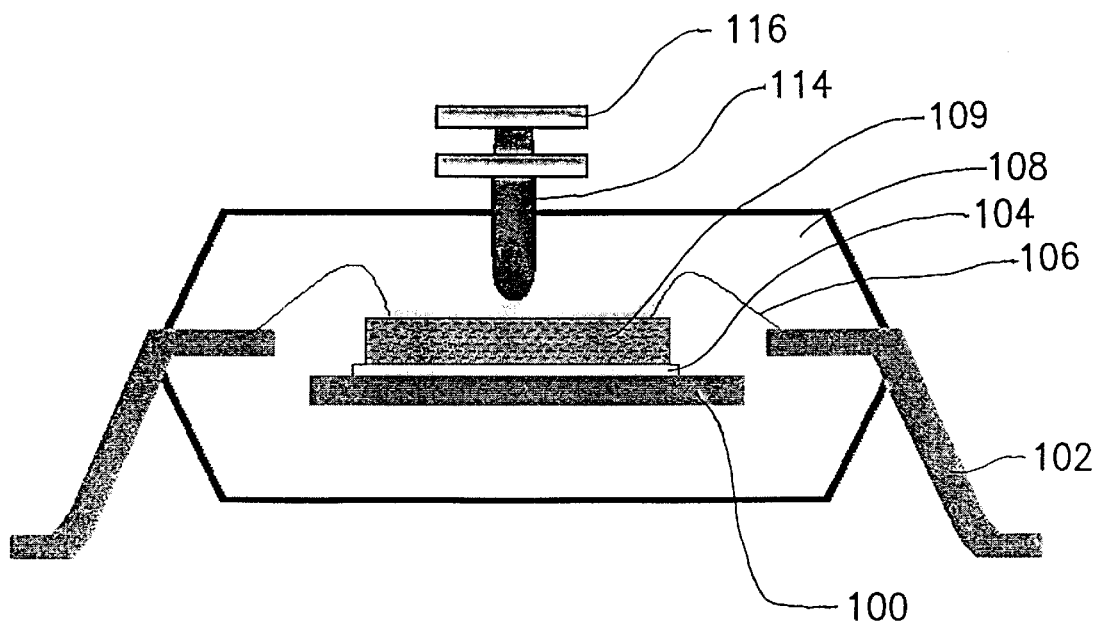
FIG. 4a is a schematic, side view of a highly heat dissipated package according to a second preferred embodiment of the present invention.
Figure 4B:
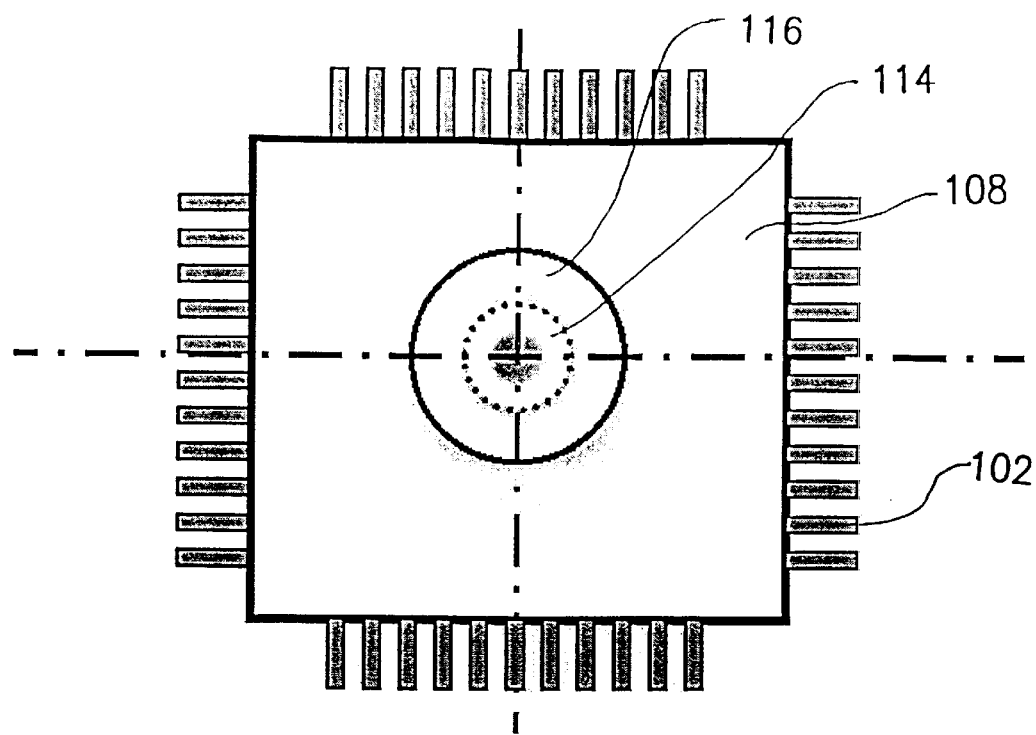
FIG. 4b is a schematic, cross sectional view of the highly heat dissipated package according the second preferred embodiment of the present invention.

FIG. 4a is a schematic, side view of a highly heat dissipated package according to a second preferred embodiment of the present invention. FIG. 4b is a schematic, cross sectional view of FIG. 4a.

In the highly heat dissipated package of this embodiment, a lead frame is used as a carrier of a chip. The lead frame consists of a die pad 100 and leads 102. The chip 109 has an active surface and a back surface. The chip 109 is adhered to the die pad 100 by the back surface of the chip 109 using an adhesive such as epoxy 104. A bonding pad (not shown) on the active surface is electrically connected to the lead 102 by a wire, such as a gold wire 106. A molding compound 108 is used to encapsulate the chip 109, the die pad 100 and the inner portions of the leads 102. The package of the present invention is provided with a heat pipe 114, one end of which is embedded in the molding compound 108, is close to the active surface of the chip 109 and is substantially normal to the chip, and the other end of which is extended outside of the molding compound 108. The heat pipe 114 can be further provided with a heat sink 116 made of a heat conductive metal, such as metal, to increase the area for heat dissipation. The heat sink 116 can be any shape, such as a sheet, fin or other shape having a larger area for heat dissipation.

Figure 5:
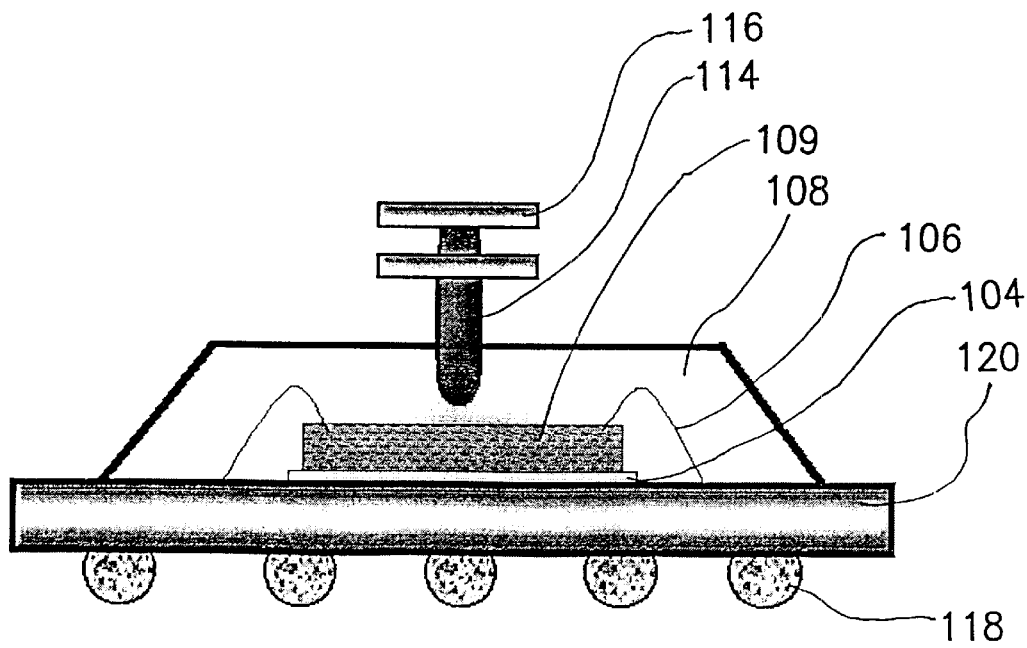
FIG. 5 is a schematic view of a plastic ball grid array (PBGA) package according to the second preferred embodiment of the present invention.

FIG. 5 is a schematic view of a plastic ball grid array (PBGA) package according to the second preferred embodiment of the present invention.

A PBGA package is one type of ball grid array (BGA) package. The PBGA package typically has a high pin account, which generates a lot of heat. Therefore, a high efficiency of heat dissipation is very important for a PBGA. A laminated board 120 is used as a carrier in the PBGA package shown. The chip 109 has an active surface and a back surface. The chip 109 is adhered to the die pad 100 by the back surface of the chip 109 using an adhesive such as epoxy 104. A bonding pad (not shown) on the active surface is electrically connected to a connection (not shown) on the laminated board 120 by a wire, such as a gold wire 106. A molding compound 108 is used to encapsulate the chip 109 and part of the laminated board 120. The laminated board 120 is connected to the printed circuit board (PCB, not shown) by solder balls 118. The package of the present invention is provided with a heat pipe 114, one end of which is embedded in the molding compound 108, is close to the active surface of the chip 109 and is substantially normal to the chip, and the other end of which is extended outside of the molding compound 108. The heat pipe 114 can be further provided with a heat sink 116 made of a heat conductive metal, such as metal, to increase the area for heat dissipation. The heat sink 116 can be any shape, such as a sheet, fin or other shape having a larger area for heat dissipation.

Figure 6:
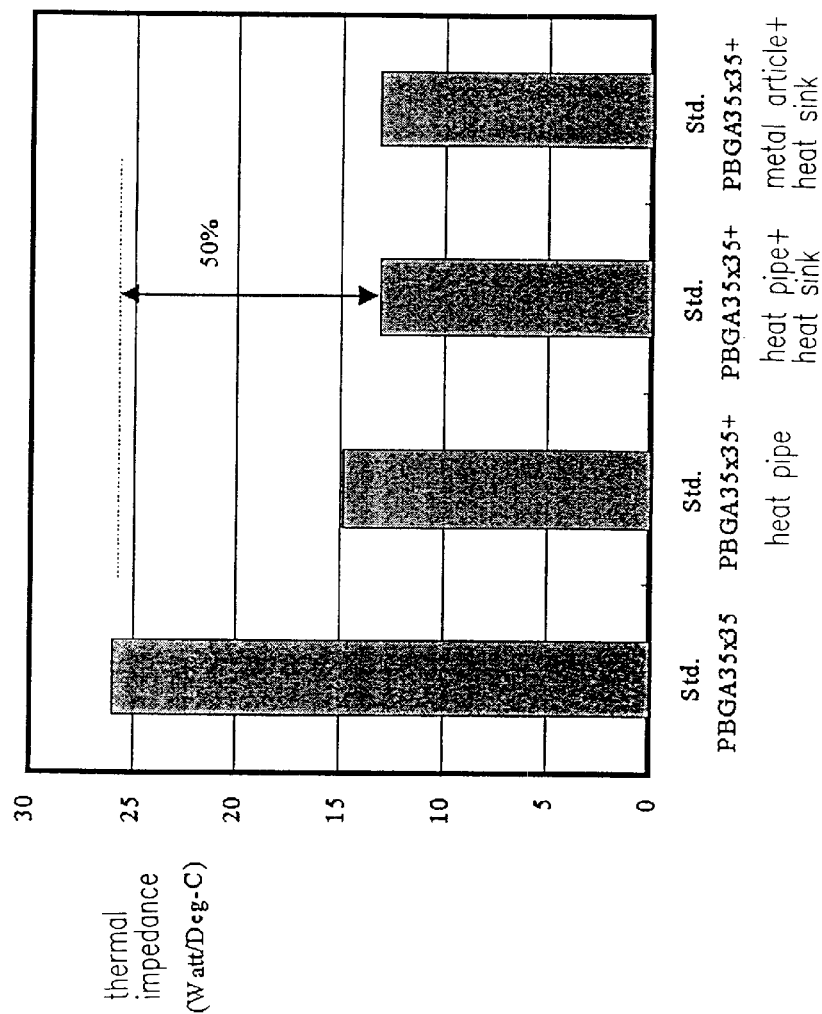
FIG. 6 is a graph showing the thermal impedance of various packages according to one preferred embodiment of the present invention.

FIG. 6 is a graph showing the thermal impedance of various packages according to one preferred embodiment of the present invention.

The various packages shown in the graph are a blank, a package provided with a heat pipe (first embodiment), a package provided with a heat pipe and a heat sink (second embodiment) and a package provided with a metal article instead of the heat pipe. As a result, FIG. 6 shows that the PBGA package of the second embodiment has a thermal impedance smaller than a conventional PBGA (the blank) by about 50%.

Figure 7:
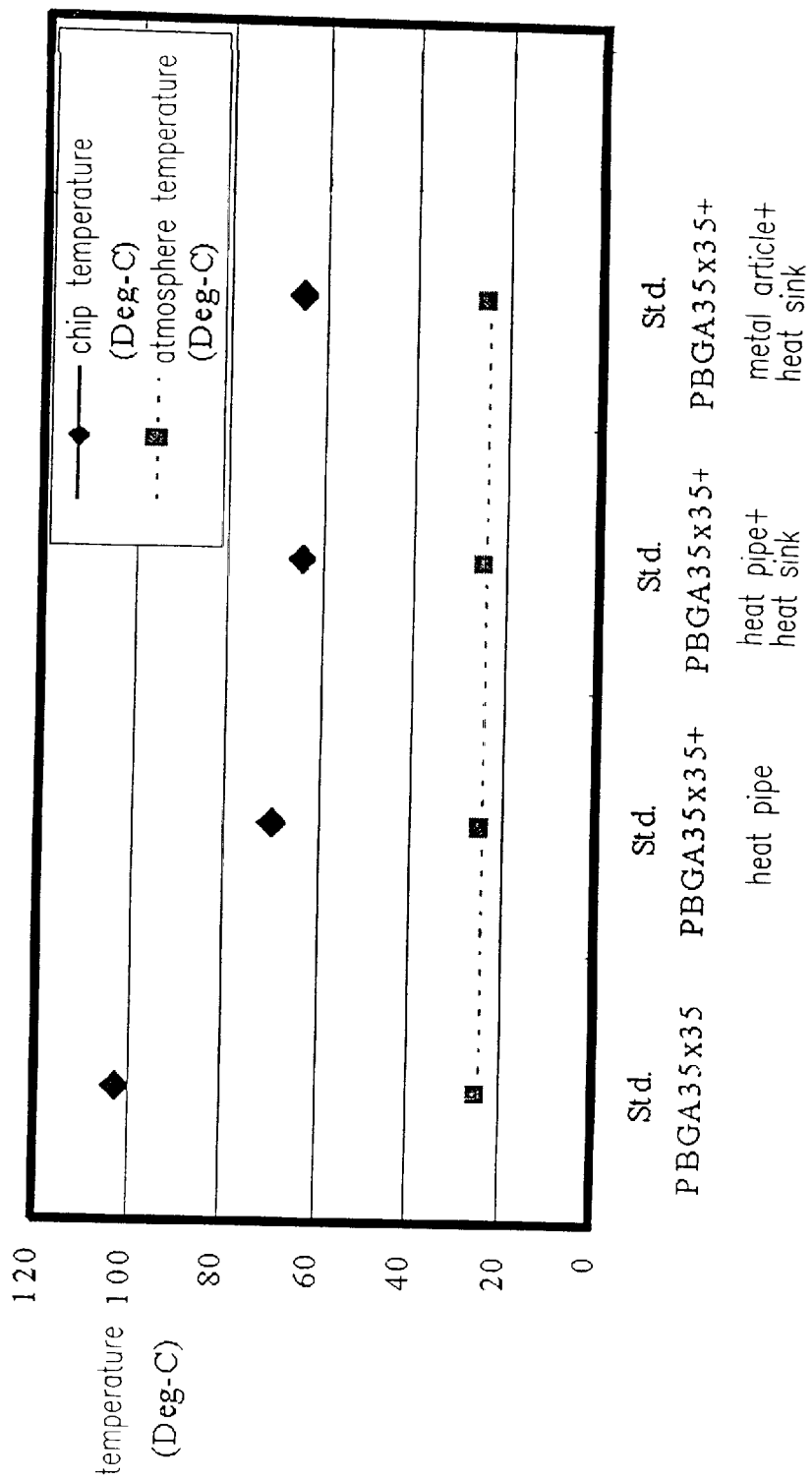
FIG. 7 is a graph showing the increase in temperature with regard to various packages.

FIG. 7 is a graph showing the increase in temperature with regard to various packages.

The various packages shown in the graph are a blank, a package provided with a heat pipe (first embodiment), a package provided with a heat pipe and a heat sink (second embodiment) and a package provided with a metal article instead of the heat pipe. As a result, FIG. 7 shows that the PBGA package of the second embodiment has a chip temperature lower than a conventional PBGA (the blank) by about 40° C.

In the above embodiments, more than one heat pipe also can be used, if necessary. From a view of foregoing, a highly heat dissipated package of the present invention can provide the following advantages. One end of the heat pipe is embedded in the package close to the chip. The other end of the heat pipe is located outside of the package. Therefore, the heat is conducted through the heat pipe and dissipated to the air.

As the demand for heat dissipation level varies, the heat pipe with different heat dissipation levels is partially placed in the package as desired.

The heat pipe is partially placed in the package during packaging, without any additional step for installing the heat pipe.

A heat sink can be optionally provided at one end of the heat pipe in order to increase the area for heat dissipation.

For a PBGA (35×35 mm) according to the present invention, the heat conductivity can be increased by more than 50%.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A package with high heat dissipation, comprising:

a carrier;

a chip located on the carrier;

a molding compound encapsulating the chip and part of the carrier; and a heat pipe, wherein one end thereof is embedded in the molding compound at a location close to the active surface of the chip, and the other end thereof is extended outside of the molding compound.

2. The package of claim 1, further comprising a heat sink coupled to the other end of the heat pipe that is extended outside the molding compound.

3. The package of claim 1, wherein the chip has an active surface and a back surface, the chip being attached to the carrier with the back of the chip, and wherein the other end of the heat pipe is embedded in the molding compound at a location close to the active surface of the chip.

4. The package of claim 1, wherein the carrier is a lead frame.

5. The package of claim 1, wherein the carrier is a laminated board.

6. The package of claim 1, wherein the heat pipe includes a heat conductive metal housing and a heat conductive liquid contained therein.

7. The package of claim 1, wherein the heat pipe is extended from one end to the other end in a direction substantially normal to the active surface of the chip.

8. The package of claim 1, wherein the chip is electrically connected to the carrier by a plurality of wires.

9. A package with high heat dissipation, comprising:

a carrier;

a chip located on the carrier, a molding compound encapsulating the chip and at least part of the carrier; and a heat pipe, wherein a first portion of the heat pipe is embedded in the molding compound, said first portion is proximate to, but separated from the active surface of the chip by said molding compound, and a second opposite portion of the heat pipe extends outside the molding compound to mount with a heat sink.

10. The package of claim 9, wherein the carrier is a leadframe.

11. The package of claim 9, wherein the carrier is a laminated board.

12. The package of claim 9, wherein the heat pipe includes a heat conductive metal housing and a heat conductive liquid contained therein.

13. The package of claim 9, wherein the heat pipe extends along a direction perpendicular to the active surface of the chip.

* * * * *